US 8,417,730 B2

Apr. 9, 2013

(12) United States Patent
Jones

(54) BLOCK COMPRESSION ALGORITHM

(75) Inventor: Paul Jones, Veenendaal (NL)

(73) Assignee: Objectif Lune Inc., Quebec (CA)

( * ) Notice: Subject to any disclaimer, the term of this patent is extended or adjusted under 35 U.S.C. 154(b) by 94 days.

This patent is subject to a terminal disclaimer.

(21) Appl. No.: 12/960,109

(22) Filed: Dec. 3, 2010

(65) Prior Publication Data

US 2011/0161372 A1    Jun. 30, 2011

Related U.S. Application Data

(63) Continuation-in-part of application No. 12/081,316, filed on Apr. 14, 2008, now Pat. No. 7,870,160.

(51) Int. Cl.
*H01F 7/00* (2006.01)

(52) U.S. Cl.
USPC .......................................... 707/795; 341/106

(58) Field of Classification Search .................. 707/795; 341/106, 51, 63; 358/1.16
See application file for complete search history.

(56) References Cited

U.S. PATENT DOCUMENTS

| | | | |
|---|---|---|---|
| 4,626,829 A * | 12/1986 | Hauck .............................. 341/63 |
| 5,473,326 A | 12/1995 | Harrington et al. |
| 5,490,260 A | 2/1996 | Miller et al. |
| 5,627,995 A | 5/1997 | Miller et al. |
| 5,805,303 A | 9/1998 | Imaizumi et al. |
| 5,864,859 A | 1/1999 | Franaszek |
| 5,867,114 A | 2/1999 | Barbir |
| 6,141,742 A | 10/2000 | Favor |
| 6,253,264 B1 | 6/2001 | Sebastian |
| 6,269,464 B1 | 7/2001 | Boussina et al. |
| 6,298,321 B1 | 10/2001 | Karlov et al. |
| 6,446,188 B1 * | 9/2002 | Henderson et al. ........... 711/206 |
| 6,529,633 B1 | 3/2003 | Easwar et al. |
| 6,747,582 B2 | 6/2004 | Morihara et al. |
| 6,857,047 B2 | 2/2005 | Basu et al. |
| 6,906,645 B2 | 6/2005 | Jones et al. |
| 6,944,347 B2 | 9/2005 | Lee et al. |
| 7,039,769 B2 | 5/2006 | Castelli et al. |
| 7,103,608 B1 * | 9/2006 | Ozbutun et al. ............... 707/604 |
| 7,142,721 B2 | 11/2006 | Chen et al. |
| 7,167,593 B2 | 1/2007 | Singh |
| 7,190,284 B1 * | 3/2007 | Dye et al. ........................ 341/51 |
| 7,870,160 B2 * | 1/2011 | Jones ............................ 707/795 |
| 2001/0051941 A1 | 12/2001 | Tonomura |
| 2002/0085764 A1 | 7/2002 | Brady |
| 2003/0034905 A1 | 2/2003 | Anton et al. |
| 2003/0229761 A1 | 12/2003 | Basu et al. |
| 2005/0262479 A1 | 11/2005 | Ageyev et al. |
| 2006/0112264 A1 | 5/2006 | Agarwal |
| 2007/0002780 A1 * | 1/2007 | Pessi ............................ 370/261 |

* cited by examiner

*Primary Examiner* — Hung T Vy

(74) *Attorney, Agent, or Firm* — McDermott Will & Emery LLP

(57) ABSTRACT

A method for compressing a data stream based on a combination of two digests is used. Each combination of digests that occurs multiple times is assigned a codeword. When the first digest matches, a data structure of second digests occurring with the same first digest is built, associating each combination of digests with a position in the stream where the combination of digests is found. When a new match is found a new codeword is defined. When a match with an existing codeword is found, a byte sequence is emitted that identifies the codeword associated with the matched data. When a partial match is found, the length of a codeword is changed and a corresponding byte sequence is emitted. The method finds particular application in data streams that are sent to printers, and which contain large blocks of identical data such as images or repetitive text.

11 Claims, 8 Drawing Sheets

BLOCK COMPRESSION ALGORITHM

RELATED APPLICATIONS

This application is a Continuation-In-Part of the U.S. patent application Ser. No. 12/081,316, filed on Apr. 14, 2008 now U.S. Pat. No. 7,870,160, the disclosure of which Application is incorporated by reference herein.

FIELD OF THE INVENTION

The present invention relates to a block compression algorithm. The present application is a Continuation-In-Part (CIP) of U.S. patent application Ser. No. 12/081,316, filed on Apr. 14, 2008, the content of which is incorporated herein by reference.

BACKGROUND OF THE INVENTION

A dictionary coder, also sometimes known as a substitution coder, is any of a number of lossless data compression algorithms which operate by searching for matches between the text to be compressed and a set of strings contained in a data structure (called the 'dictionary') maintained by the encoder. When the encoder finds such a match, it substitutes a reference to the string's position in the data structure. Commonly used algorithms such as LZ77/78, LZW, LZO, DEFLATE, LZMA and LZX are geared towards finding small repetitions in the data that is to be compressed.

The problem with the aforementioned dictionary coders is that they build a dictionary of sequences of bytes processed, where each such sequence is assigned a codeword. Generally there is an upper limit on the number of codewords that can be used. When all codewords have been assigned to sequences of bytes the algorithm must decide how to proceed when it wants to add a new sequence to the dictionary. In many cases the algorithm will simply reset the mapping of codewords to sequences of bytes and restarts the compression process of the rest of the data as if the first part of the data had never been processed. This situation is triggered when there is a sufficiently large sequence of bytes with very little repetition of data.

When trying to compress a print stream using one of the aforementioned dictionary coders one may find that the dictionary coder resets quite often. Typically this occurs when there are large amounts of image and font data included in the print stream. Each time the dictionary coder processes some image data it will run out of codewords and perform a reset. This causes the dictionary coder to forget any sequences it has seen before the image data which may actually repeat itself after the image data. More importantly it also forgets the sequences found in the image data. The next time the dictionary coder hits an image (even if the image was an exact copy of the previous image encountered) it is treated by the dictionary coder as new data resulting in very little compression of the print stream.

Unfortunately many print streams actually contain large amounts of repeated data as each page of the print stream is generated from a template (either manually or automatically) that include similar text (such as address info, salutation, etc.) and imagery (such as logos or signatures). For instance in a direct mail application each page of the print stream may be a letter to a potential customer. Typically such letters are generated from a template where the only variable parts are the address and the salutation. Therefore the main text and imagery (logos, signatures, product photos, etc.) are often exactly the same for every recipient. Each page in the print stream will therefore have a large amount of text and image data encoded that is exactly the same on each page. It should therefore be possible and advantageous to compress such files considerably.

It is not uncommon that a print stream contains the print data for thousands of recipients. Storing such files on hard disk before sending them to the printer may therefore require large amounts of storage (without compression). Transferring such a print stream via a network to the printer may also take quite a while depending on the available network bandwidth. Although it is not uncommon for (internal) networks to use 100 Mbit or 1 Gbit connections, the network connections between multiple geographically separated locations have bandwidth limits imposed on them for cost reasons. Compressing the print stream may therefore be the only viable solution to transferring files across a bandwidth limited network in a reasonable time frame and at a reasonable cost.

SUMMARY OF THE INVENTION

Thus, the present invention provides a method for compressing a data stream containing large blocks of identical data, as well as the compressed stream of data itself.

In accordance with one aspect of the invention, there is provided a computer-implemented method for encoding a data stream of bytes, said method comprising the steps of:
  (a) receiving said data stream;
  (b) providing a fixed-length lookahead window for said data stream, the lookahead window having a start position;
  (c) determining a first digest of said window;
  (d) determining if the first digest of said window has a corresponding entry in a primary data structure;
  (e) storing in the primary data structure, a position in the data stream corresponding to the start position of said window if the primary data structure does not include an entry corresponding to the first digest of said window;
  (f) if the primary data structure includes an entry corresponding to the first digest of said window, modifying the entry to include a secondary data structure of second digests each occurring with the same first digest and associating each second digest included in the secondary data structure with a respective position in the data stream where the combination of the first and second digests was found;
  (g) if the primary data structure already contains a secondary data structure of second digests, determining if the second digest of the current lookahead window is present in the secondary data structure contained in the primary data structure;
  (h) if the second digest of the current lookahead window is not present in the secondary data structure contained in the primary data structure, modifying the secondary data structure contained in the primary data structure to associate the second digest of the current lookahead window with the start position of the lookahead window in the data stream;
  (i) if the second digest of the current lookahead window is present in the secondary data structure contained in the primary data structure, determining a length of a matching portion by reading first data from a first location in the data stream at which the combination of first and second digests was found and comparing the first data from the first location with second data starting at the start position of the current lookahead window, and storing the length of the matching portion in the secondary data structure and assigning a codeword to the sequence of bytes in the matching portion;

(j) if the combination of digests for the current lookahead window already has an associated length and the length of the matching portion is greater than zero and less than the associated length, the length of a codeword assigned to the combination of digests of the current lookahead window is shortened in accordance with the length of the matching portion;

(k) continuing processing at a location in the data stream of a next non-matching byte until the data stream has been fully processed;

(l) after completing steps (a)-(j), further processing blocks of unmatched data by a dictionary coder adapted to find small repetitions of data; wherein the method is performed by a computer programmed to perform steps (a)-(l).

In accordance with another aspect of the invention, there is provided a computer-implemented method for encoding a data stream of bytes, said method comprising the steps of:

(a) receiving said data stream;

(b) providing a fixed-length lookahead window for said data stream, the lookahead window having a start position;

(c) determining a first digest of said window;

(d) determining if the first digest of said window has a corresponding entry in a primary data structure;

(e) storing in the primary data structure, a position in the data stream corresponding to the start position of said window if the primary data structure does not include an entry corresponding to the first digest of said window;

(f) if the primary data structure includes an entry corresponding to the first digest of said window, modifying the entry to include a secondary data structure of second digests each occurring with the same first digest and associating each second digest included in the secondary data structure with a respective position in the data stream where the combination of the first and second digests was found;

(g) if the primary data structure already contains a secondary data structure of second digests, determining if the second digest of the current lookahead window is present in the secondary data structure contained in the primary data structure;

(h) if the second digest of the current lookahead window is not present in the secondary data structure contained in the primary data structure, modifying the secondary data structure contained in the primary data structure to associate the second digest of the current lookahead window with the start position of the lookahead window in the data stream;

(i) if the second digest of the current lookahead window is present in the secondary data structure contained in the primary data structure, determining a length of a matching portion by reading first data from a first location in the data stream at which the combination of first and second digests was found and comparing the first data from the first location with second data starting at the start position of the current lookahead window, and storing the length of the matching portion in the secondary data structure and assigning a codeword to the sequence of bytes in the matching portion;

(j) if the combination of digests for the current lookahead window already has an associated length and the length of the matching portion is greater than zero and less than the associated length, the length of a codeword assigned to the combination of digests of the current lookahead window is shortened in accordance with the length of the matching portion; and (k) continuing processing at a location in the data stream of a next non-matching byte until the data stream has been fully processed;

wherein the method is performed by a computer programmed to perform steps (a)-(k).

Preferably, the data stream is a print stream. Still preferably, the primary data structure is a lookup table and secondary data structure is a binary tree.

Preferably, each of the first and second digests has a length of three bytes, the first digest consisting of a first byte, a middle byte and a second-to-last byte of the lookahead window and the second digest consisting of a second byte, a byte after the middle byte and a last byte of the lookahead window. Alternatively, the first and second digests are created by splitting a single digest into two parts.

Still preferably, combination of first and second digests are stored at intervals of bytes of the data stream (instead of at each byte) in order to reduce data storage. In other words, instead of storing a digest at each byte of the data stream, a digest is stored at increments of bytes (i.e. intervals of bytes). The intervals correspond to half the size of the lookahead window or less. Thus steps (e), (f) and (h) are only performed on interval boundaries. This reduces storage requirements but also introduces the possibility of not finding the earliest position at which a match occurs. Therefore, at step (i) of the above method, the length of the matching portion is preferably determined by further reading the data stream backward from the start position of the lookahead window to find an earlier position at which a longer match can be found.

In accordance with yet another aspect of the invention, there is provided a computer-implemented method for compressing a data stream of bytes based on a combination of two digests, the method comprising:

assigning each combination of two digests a codeword with a location and a length of a data associated with the codeword; and when a combination of first and second digests is located in the data stream, building a data structure of second digests each occurring with the same first digest, associating each combination of first and second digests with a position in the data stream where the combination of first and second digest is found, so that when the length of a codeword is changed, a byte sequence is emitted that identifies the codeword being changed and the length of the codeword is updated, so that when a match is found, a byte sequence is emitted that identifies a codeword associated with the matched data, wherein the method is performed by a computer programmed to perform the method.

In accordance with yet another aspect of the invention, there is provided a computer-implemented method of generating a compressed data stream comprising blocks of data interspersed with codeword definitions and usage sequences, the method comprising:

emitting a byte sequence, when a new codeword is assigned, that identifies first and second digests, a location and a length of data assigned to the codeword;

emitting a byte sequence, when the length of a codeword length is changed, that identifies which codeword is to be changed and it's new length; and emitting a byte sequence, when a match is found, that identifies the codeword associated with the matched data, wherein a codeword is based on a combination of first and second digests, wherein the method is performed by a computer programmed to perform the method.

In accordance with yet another aspect of the invention, there is provided a compressed data stream consisting of blocks of data interspersed with codeword definitions and usage sequences, whereby when a new codeword is assigned, a byte sequence is emitted that identifies first and second digests the location and length of the data assigned to the codeword and whereby when the length of a codeword length is changed a byte sequence is emitted that identifies which codeword is to be changed and it's new length and whereby when a match is found a byte sequence is emitted that identifies the codeword associated with the matched data, wherein a codeword is based on a combination of first and second digests. Preferably, length bytes are used to identify the length of the other blocks of data. Still preferably, blocks of unmatched data have been further processed by a dictionary coder adapted to find small repetitions of data.

Preferably, as mentioned above, there is provided a method to reduce the amount of storage needed by only storing a digest in either the lookup table or binary tree at intervals no greater than half the size of the lookahead window, where the size of the lookahead window is chosen to match the smallest amount of data that is allowed to be associated with a codeword. Thus, the compression algorithm may not find the largest possible match between two blocks of data. In order to compensate, step (i) of the method must scan backward from the location found for the two matching digests to find the earliest possible start for a match.

As also mentioned above, there is preferably provided a first digest that consists of the first, middle and second last byte of the lookahead window and a second digest that consists of the second, middle+1 and last byte of the lookahead window. Experimentation has shown that the use of a digest which includes data from the beginning and end of the lookahead window reduces the chance of a false positive for a match. A false positive occurs when two lookahead windows with different content have the same two digests. Having two digests that use the same basic calculations but offset by one byte also reduces the number of calculations needed in the compression stage as the second digest of a lookahead window equals the first digest of the next lookahead window.

The objects, advantages and features of the present invention will become more apparent upon reading of the following non-restrictive description of preferred embodiments thereof, given for the purpose of exemplification only, with reference to the accompanying drawings.

BRIEF DESCRIPTION OF THE DRAWINGS

The present invention will be better understood after having read a description of a preferred embodiment thereof, made in reference to the following drawings in which.

DESCRIPTION OF A PREFERRED
EMBODIMENT OF THE INVENTION

The embodiments mentioned or described in the present description and/or shown in the figures are embodiments of the present invention, given for exemplification purposes only. Namely, the figures are based on simple digests, where the first digest consists of the first 3 bytes of the lookahead window and the second digest consists of the next 3 bytes of the lookahead window.

Compression

Figure 1:
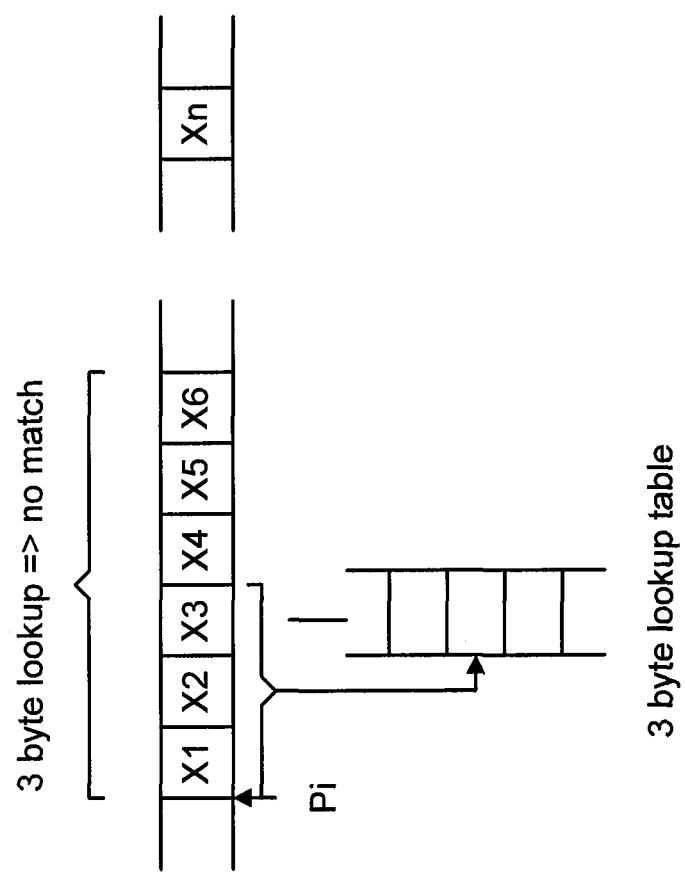
FIG. 1 shows the three byte lookup table in a data stream with no match.

The present invention concerns a compression scheme that allows the compression of print streams (but is not limited in application to print streams). This algorithm uses the fact that a digest of 3 bytes has a statistically low probability (1 in 16 million) of occurring in random data and that the combination of two digests has an even lower probability (1 in 281 trillion) of occurring in random data. The print stream is processed byte for byte using a fixed length lookahead window. A first digest is used to lookup whether this digest has been seen before (see FIG. 1):

If this digest has never been seen before, the position in the file of this sequence is stored in the lookup table.

Figure 2:
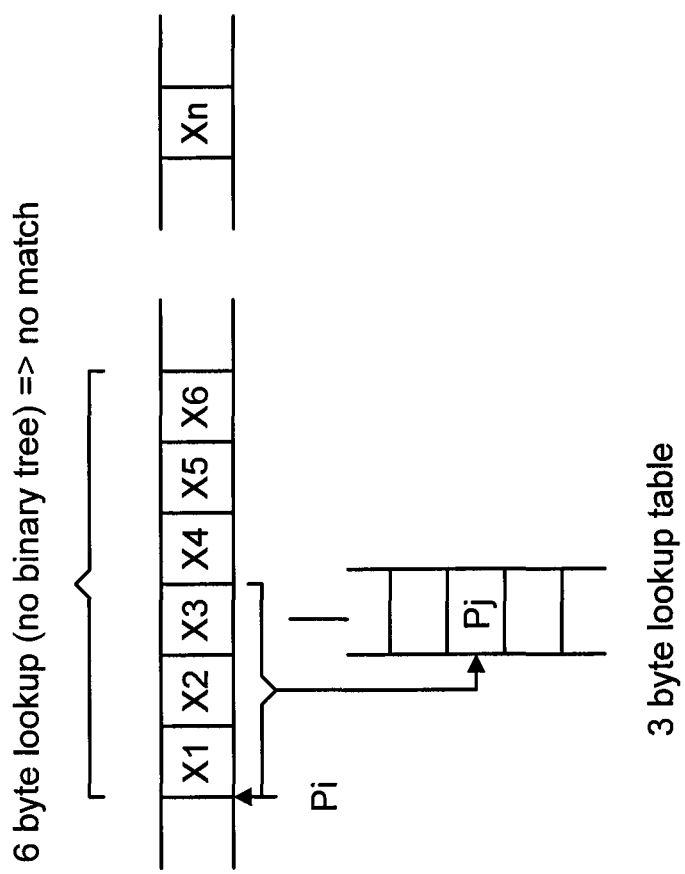
FIG. 2 shows the 6 byte lookup table without a binary tree and no match.

If the lookup table already contains a position for this digest then the entry in the lookup table is modified to include a binary tree of second digests that occur with the same first digest (see FIG. 2). Each combination of digests is associated with a position within the file where that combination of digests was first found.

Figure 3:
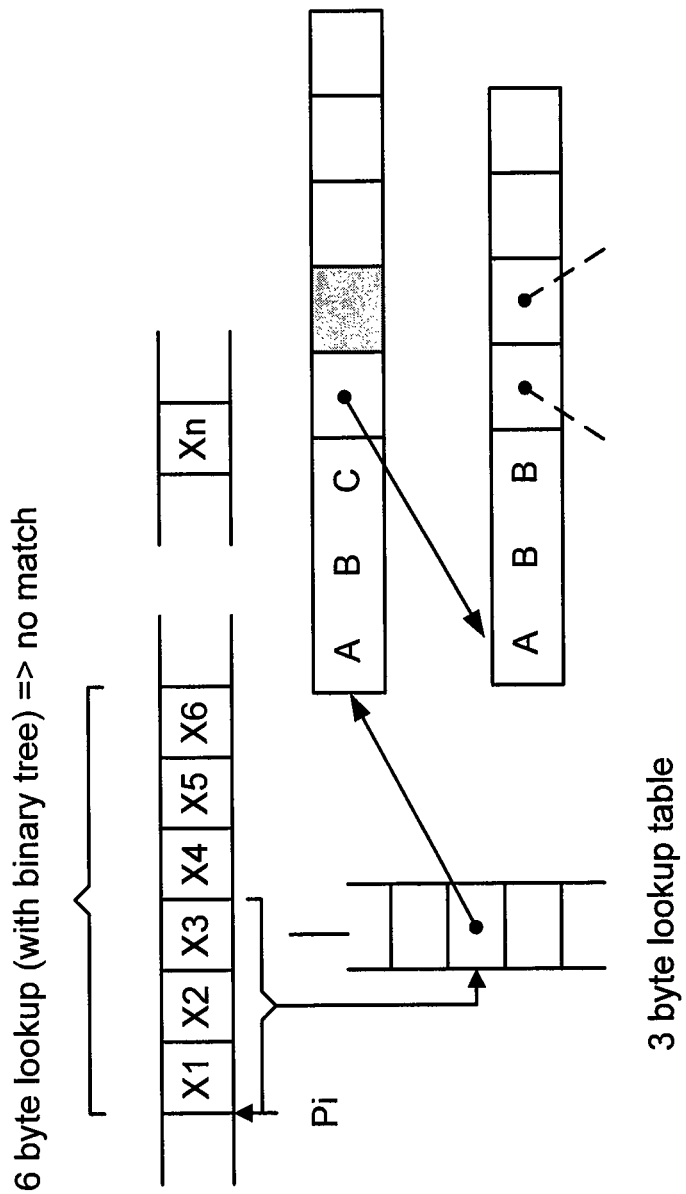
FIG. 3 shows the 6 byte lookup table with a binary tree but no match.
Figure 4:
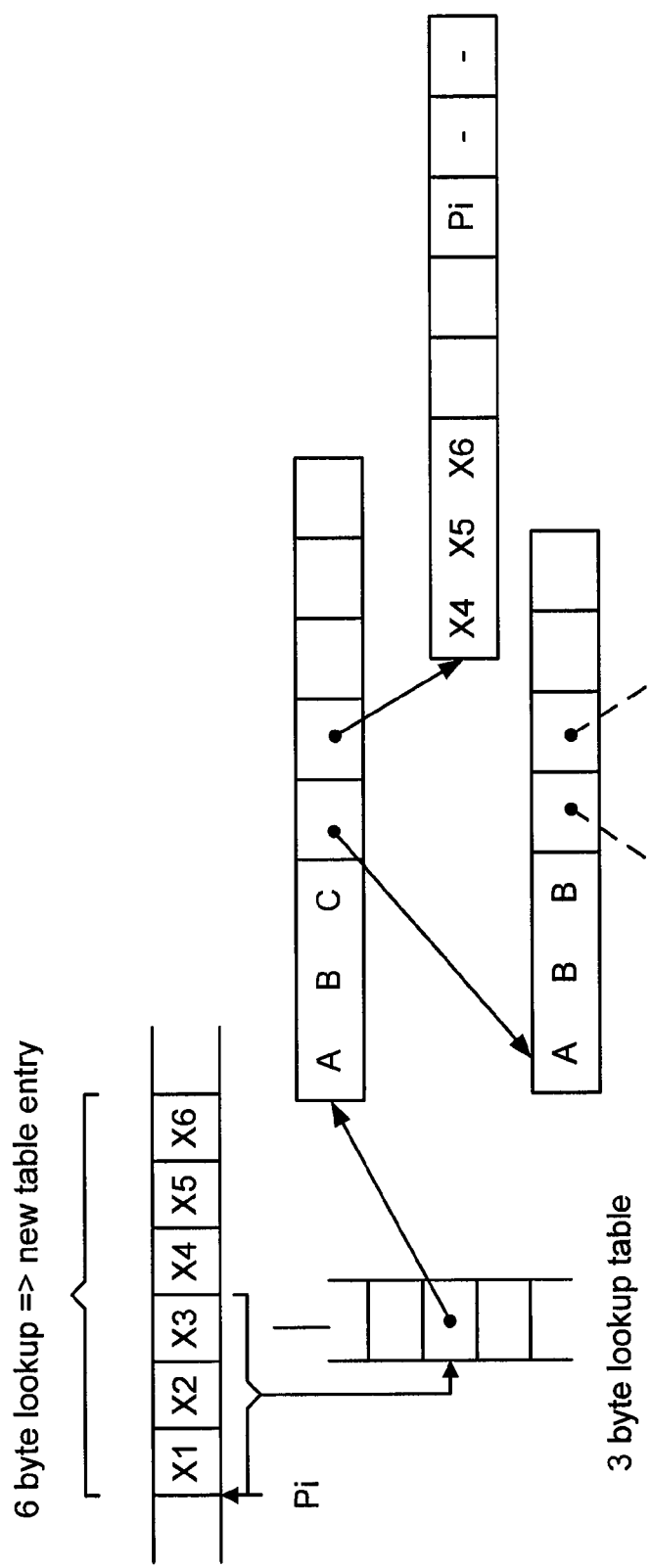
FIG. 4 shows the 6 byte lookup table for a new entry.

If the lookup table already contains a binary tree of digests, the tree is searched to see if the combination of digests is already present (see FIG. 3). If the combination of digests is not present an entry is made in the binary tree associating the combination of digests with the current position in the print stream (see FIG. 4).

Figure 5:
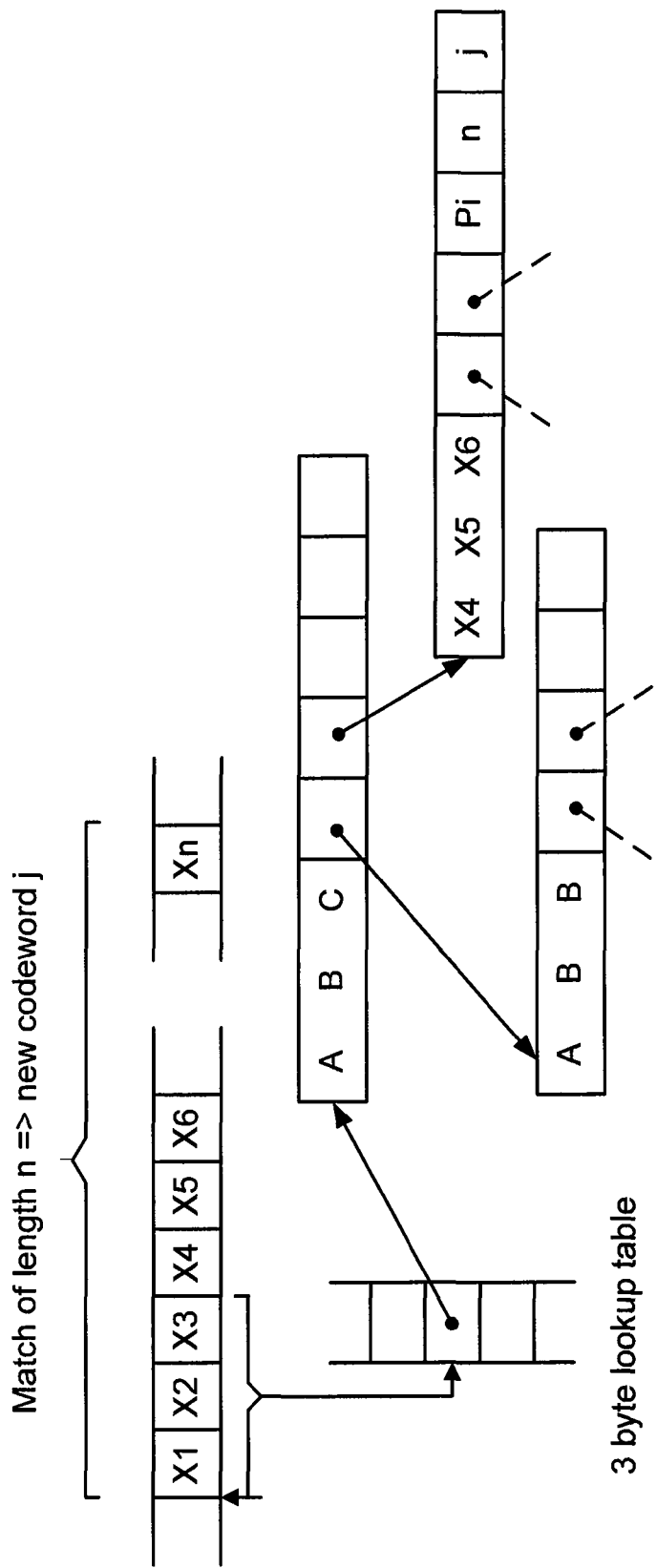
FIG. 5 shows the match of length n giving a new codeword j.

If the digests of the look ahead windows represent a combination of digests that has already been processed by the compression algorithm, the following matching process starts:

If this is the second time that the combination of digests is found the algorithm must determine the length of the match. It does this by reading data from the first location at which the combination of digests was found and comparing it with the data starting at the beginning of the current look ahead window. The length of the matching portion of data is then stored in the tree and a codeword is assigned to the sequence of matching data. Processing then continues at the location of the first non-matching byte (see FIG. 5).

If this combination of digests already has a length associated with it, the matching process proceeds by matching data from the first location this sequence was found up to the given length with the data starting at the beginning of the current lookahead window. If a partial match is found, the length of the codeword assigned to the combination of digests is shortened to the length of the partial match. Processing continues at the location of the first non-matching byte.

The above process assigns codewords to every sequence of repeating data in the print stream with a length of the lookahead window or more. Each codeword is associated with a unique combination of digests and the location and length of the sequence of repeating data.

Figure 6:
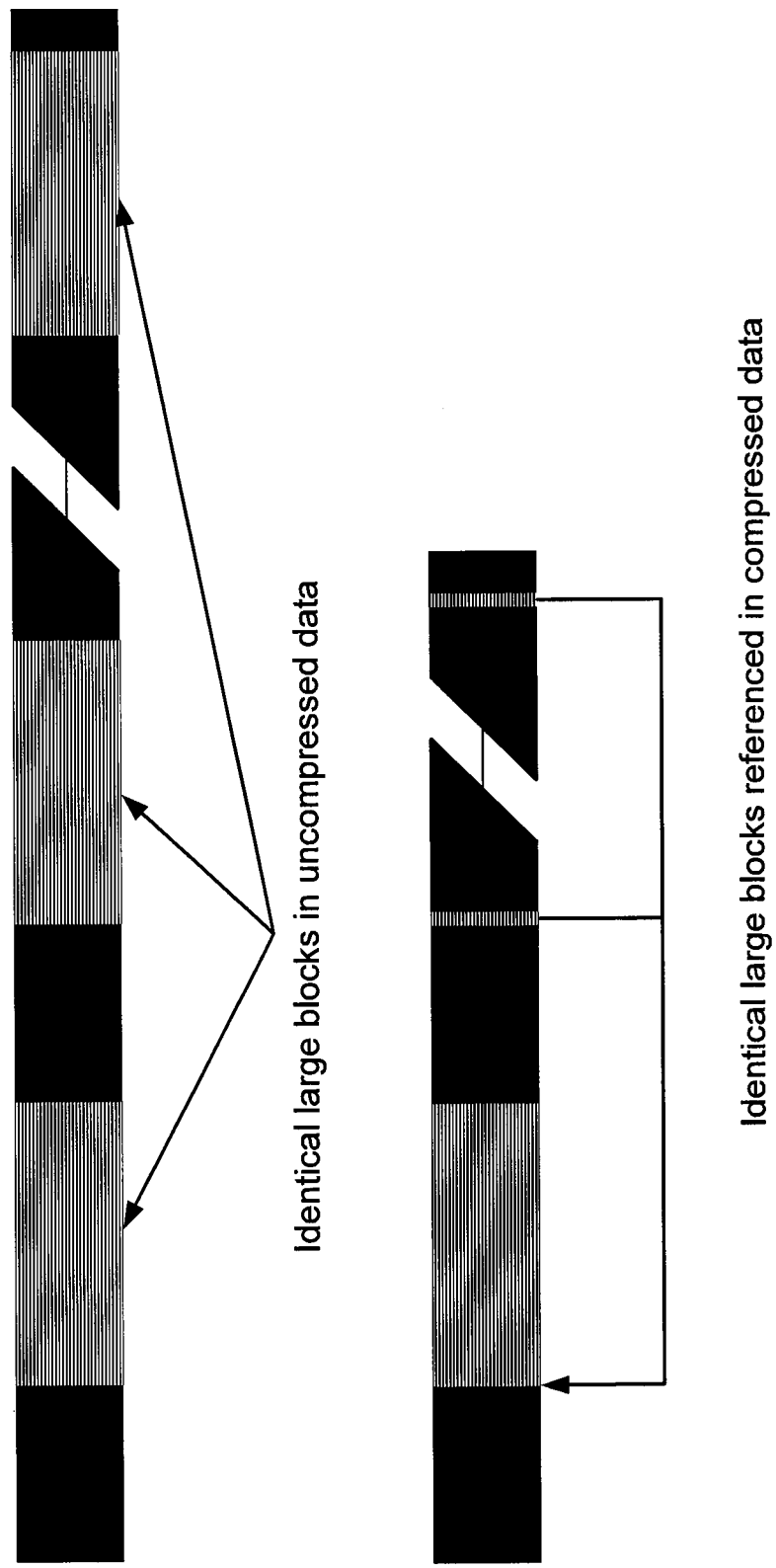
FIG. 6 shows the original data stream with identical large blocks of data and the same data stream with identical large blocks referenced in compressed data.

The compressed print stream is generated "on the fly" and consists of blocks of data interspersed with codeword definition and usage sequences (see FIG. 6).

Whenever a new codeword is assigned, a byte sequence is emitted that identifies the location and length of the data assigned to the codeword. Whenever the length of a codewords length is changed a byte sequence is emitted that identifies which codeword is to be changed and it's new length. Whenever a match is found a byte sequence is emitted that identifies the codeword associated with the matched data. To simplify encoding of these byte sequences, length bytes are used to identify the length of the other blocks of data (see FIG. 2).

Further compression of the output can be achieved by passing the blocks of unmatched data to a dictionary coder. The dictionary coder will find small repetitions and will not be disturbed by the large sequences of repeating data (as these were filtered out of the data passed to the dictionary coder), thereby reducing the number of resets.

Decompression

Decompression of data compressed the above algorithm proceeds as follows:

If a block of data is encountered the encoded length is used to determine how many bytes must be sent to the dictionary coder for decompression. The decoded data is then appended to the output If a codeword definition sequence is found, the next available codeword is assigned to the decoded length and location of the data to be assigned to the codeword. The data assigned to the codeword is read and appended to the output. As this point this data may be added to a cache to reduce (disk) read operations.

If a codeword modification sequence is found, the codeword is decoded and the length for that codeword is updated (the parts of the data no longer associated to the codeword may now be purged from the cache). The (cached) data now assigned to that codeword is then appended to the output.

If a codeword match sequence is found, the codeword is decoded and the (cached) data for that codeword is then appended to the output.

Compressing Across Multiple Print Streams

The block compression algorithm can be easily modified to allow the codewords and their associated data to be persistent. This may be advantageous when in stead of sending one large print stream; many smaller print streams are used. This may occur in distributed printing, where documents are printed on demand at the point of sale. Examples of such documents are statements, bills and rental agreements. As each document is build from a template, each of the generated print streams will contain the same sequences of data. This may also be advantageous for print streams generated from non-templated documents that adhere to a corporate house style, as these documents are often required to contain certain imagery (such as logo's and signatures) and text (such as company address info, disclaimers, salutations). The device setup code included in each print stream will also often be the same and can therefore be compressed.

The compressing and decompressing system can work together such that they each store the repeating sequences of data and agree upon a codeword for each such sequence.

The compressing system can incorporate cached sequences of data into its lookup tables
by:
calculating the two digests of each cached sequence of data
using the first digest of that data to locate in which entry to create a binary tree of second digests.
adding the second digests into the appropriate binary tree and associating the length and location of the cached data with that combination of digests and assigning a codeword to it.

If the compressing and decompressing system process each cached entry in a predefined order (for instance sorted by the combined value of the two digests associated with the cached data) they will assign the same codewords to the same data. As long as both systems maintain the same set of cached items, the codewords can be safely used in compression and decompression.

A bi-directional communication protocol between compressing and decompressing system can be used to ensure that the set of cached items is the same on both systems.

One method would be for the compressing and decompressing systems to maintain a MD5 checksum over all the cached data (processed in the predefined order used to assign codewords). Using the MD5 checksum the systems can quickly establish whether they have the same set of cached items. If a difference is detected, the compressing system could send the decompressing system the correct set of cached items, before proceeding with sending the compressed print stream.

Printer Centric Compression and Decompression

Some page description languages (or print technologies) have the capability to store and recall partial page descriptions. Examples are PCL (which support macros) and PostScript (which supports forms and reusable object streams). These capabilities can be used to implement the decompression step of the block compression algorithm without the need of a separate decompression system. Some printers have capabilities to run user-defined programs on their systems using various API's such as MEAP (for Canon devices), SDK/J (for Ricoh devices), CHAI (for HP devices), etc. These technologies could also be used to allow printer-centric decompression.

For PDL based decompression to work the original print stream must be in a page description language (PDL) that supports printer based decompression (such as PCL or PostScript). The block compression algorithm must be slightly modified to:

ensure that it only caches sequences of data that can be converted into a partial page description in the PDL. For PCL this means that an escape sequence must be treated as an atomic unit by the compression algorithm and must either be completely included in a cached item or completely left out. For PostScript it means that caching must occur at token boundaries (see the PostScript Language Reference Manual for the definition of a token).
modify the output of the compression algorithm to use the necessary PDL commands to store or recall a cached item.

Controlling the Sequences that may be Cached

The input processing stage of the block compression algorithm can be modified to allow a filter to determine at which locations a block may start or end. Only at these locations the block compression algorithm should process the combination of digests to find matching data. In the matching phase the same filter can be used to modify the length of the found match before it is stored to ensure that the end position of the matched data is in a location that the filter allows a block to end at.

Output Encoding for Printer Centric Decompression

Figure 7:
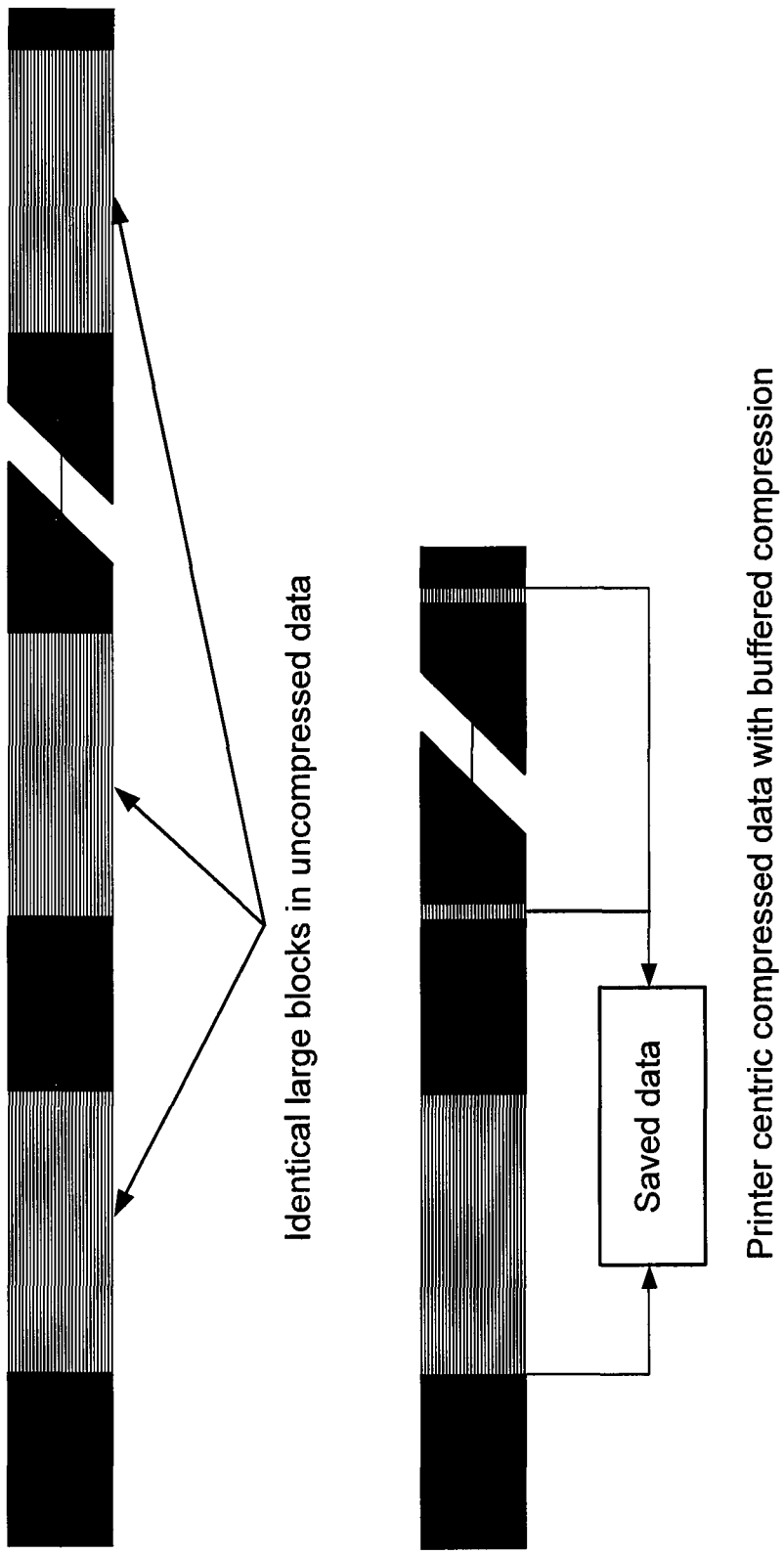
FIG. 7 shows the original data stream with identical large blocks in uncompressed data and the printer centric compressed data with buffered compression.

To define a sequence of data as reusable in a PDL one must generally precede the data with commands to setup storage of the data that follows. This differs from the default method used in the block compression algorithm, where the decompressing system is expected to buffer the decompressed output until decompression is complete (see FIG. 7).

One of two approaches can be used:
the compressing system buffers the output to allow commands to be inserted in the output before sending the output to the printer
the compressing system inserts the commands and the reusable data in the output stream when it defines a new codeword.

Figure 8:
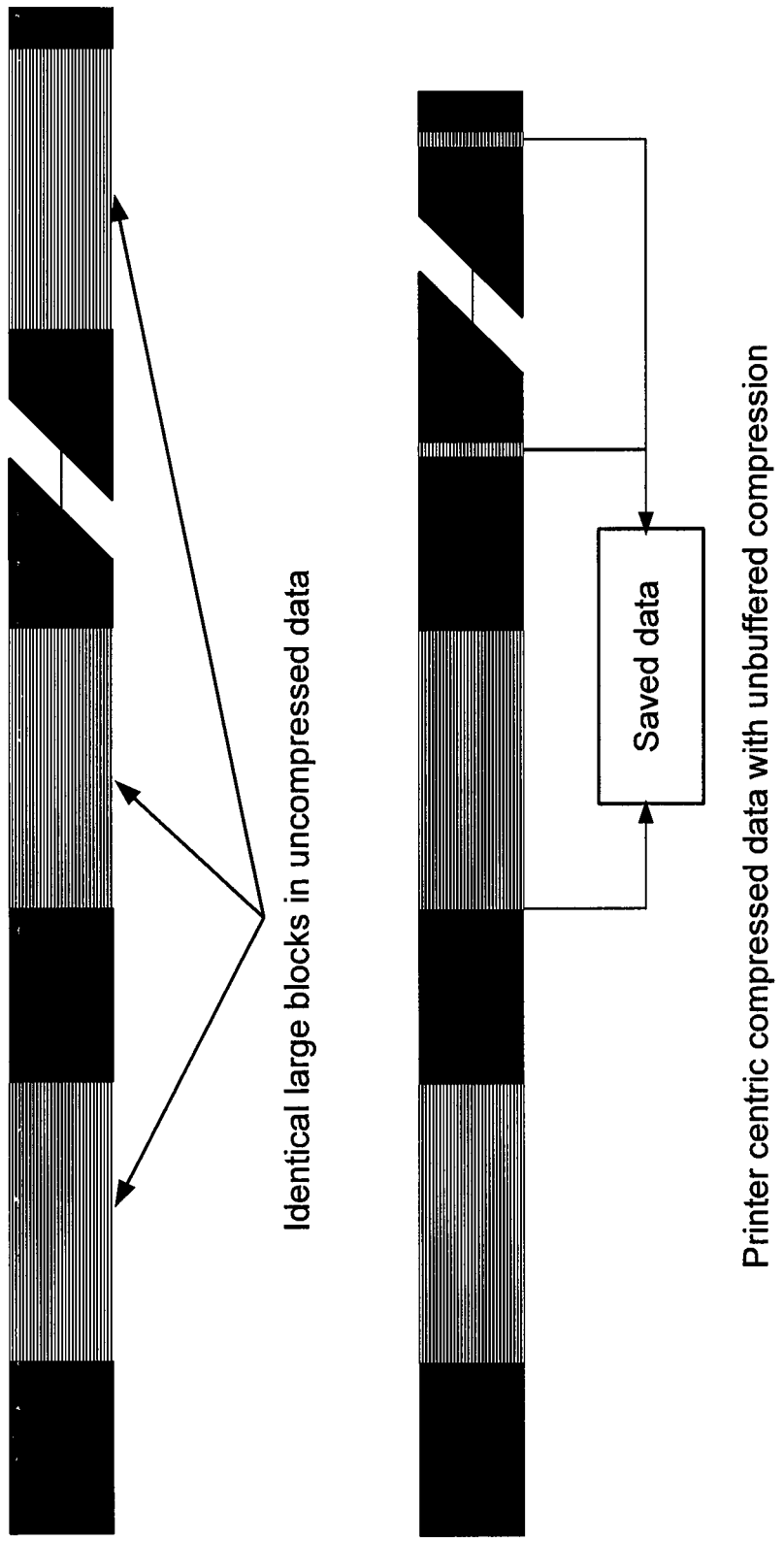
FIG. 8 shows the original data stream with identical large blocks in uncompressed data and the printer centric compressed data with unbuffered compression.

The second approach has the advantage of being able to send the output to the printer while compressing the output, but also has the disadvantage that the data that makes up a cached item is included twice in the output stream (see FIG. 8). The first approach generates the smallest output files but cannot send the compressed print stream to the printer until compression is complete.

A variant of the two approaches is also possible by limiting the amount of output buffering in the compression system to a large enough size. This may cause some reusable items to be defined using the first approach and some using the second approach depending on whether the part of the output stream that already contains the cacheable data is still in the output buffer or not.

Please note that for PDL's that support persisting cache items (such as PCL and PostScript printers with permanent storage devices), it is also possible to compress across multiple print streams as described earlier. The compressing system must then use device-specific methods or user-intervention to ensure that the cached items remain synchronized with the printer.

Depending on the PDL used the second level of compression as described in the block compression algorithm may or may not be possible. This depends on whether the PDL supports compression. For instance, PostScript printers do support various compression algorithms such as LZW and Flate and may therefore yield a better overall compression than for instance a PCL printer that does not.

The invention claimed is:

1. A computer-implemented method for encoding a data stream of bytes, said method comprising the steps of:
    (a) receiving said data stream;
    (b) providing a fixed-length lookahead window for said data stream, the lookahead window having a start position;
    (c) determining a first digest of said window;
    (d) determining if the first digest of said window has a corresponding entry in a primary data structure;
    (e) storing in the primary data structure, a position in the data stream corresponding to the start position of said window if the primary data structure does not include an entry corresponding to the first digest of said window;
    (f) if the primary data structure includes an entry corresponding to the first digest of said window, modifying the entry to include a secondary data structure of second digests each occurring with the same first digest and associating each second digest included in the secondary data structure with a respective position in the data stream where the combination of the first and second digests was found;
    (g) if the primary data structure already contains a secondary data structure of second digests, determining if the second digest of the current lookahead window is present in the secondary data structure contained in the primary data structure;
    (h) if the second digest of the current lookahead window is not present in the secondary data structure contained in the primary data structure, modifying the secondary data structure contained in the primary data structure to associate the second digest of the current lookahead window with the start position of the lookahead window in the data stream;
    (i) if the second digest of the current lookahead window is present in the secondary data structure contained in the primary data structure, determining a length of a matching portion by reading first data from a first location in the data stream at which the combination of first and second digests was found and comparing the first data from the first location with second data starting at the start position of the current lookahead window, and storing the length of the matching portion in the secondary data structure and assigning a codeword to the sequence of bytes in the matching portion;
    (j) if the combination of digests for the current lookahead window already has an associated length and the length of the matching portion is greater than zero and less than the associated length, the length of a codeword assigned to the combination of digests of the current lookahead window is shortened in accordance with the length of the matching portion;
    (k) continuing processing at a location in the data stream of a next non-matching byte until the data stream has been fully processed;
    (l) after completing steps (a)-(j), further processing blocks of unmatched data by a dictionary coder adapted to find small repetitions of data;
wherein the method is performed by a computer programmed to perform steps (a)-(l).

2. The method according to claim 1, wherein said data stream is a print stream.

3. The method according to claim 1, wherein the primary data structure is a lookup table and secondary data structure is a binary tree.

4. The method according to claim 1, wherein each digests has a length of three bytes, the first digest consisting of a first byte, a middle byte and a second-to-last byte of the lookahead window and the second digest consisting of a second byte, a byte after the middle byte and a last byte of the lookahead window.

5. The method according to claim 1, wherein the first and second digests are created by splitting a single digest into two parts.

6. The method according to claim 1, wherein the combination of first and second digests are stored at intervals of bytes of the data stream, the intervals being of no more than half the size of the lookahead window.

7. The method according to claim 1, wherein at step (i), the length of the matching portion is determined by further reading the data stream backward from the start position of the lookahead window to find a position at which a longer match can be found.

8. A computer-implemented method of generating a compressed data stream with the method for encoding in accordance with claim 1, wherein the compressed data stream comprises blocks of data interspersed with codeword definitions and usage sequences.

9. The method according to claim 8 further comprising identifying lengths of other blocks of data with length bytes.

10. The method according to claim 8, further comprising processing blocks of unmatched data of said data stream of bytes by a dictionary coder adapted to find small repetitions of data.

11. A computer-implemented method for encoding a data stream of bytes, said method comprising the steps of:
 (a) receiving said data stream;
 (b) providing a fixed-length lookahead window for said data stream, the lookahead window having a start position;
 (c) determining a first digest of said window;
 (d) determining if the first digest of said window has a corresponding entry in a primary data structure;
 (e) storing in the primary data structure, a position in the data stream corresponding to the start position of said window if the primary data structure does not include an entry corresponding to the first digest of said window;
 (f) if the primary data structure includes an entry corresponding to the first digest of said window, modifying the entry to include a secondary data structure of second digests each occurring with the same first digest and associating each second digest included in the secondary data structure with a respective position in the data stream where the combination of the first and second digests was found;
 (g) if the primary data structure already contains a secondary data structure of second digests, determining if the second digest of the current lookahead window is present in the secondary data structure contained in the primary data structure;
 (h) if the second digest of the current lookahead window is not present in the secondary data structure contained in the primary data structure, modifying the secondary data structure contained in the primary data structure to associate the second digest of the current lookahead window with the start position of the lookahead window in the data stream;
 (i) if the second digest of the current lookahead window is present in the secondary data structure contained in the primary data structure, determining a length of a matching portion by reading first data from a first location in the data stream at which the combination of first and second digests was found and comparing the first data from the first location with second data starting at the start position of the current lookahead window, and storing the length of the matching portion in the secondary data structure and assigning a codeword to the sequence of bytes in the matching portion;
 (j) if the combination of digests for the current lookahead window already has an associated length and the length of the matching portion is greater than zero and less than the associated length, the length of a codeword assigned to the combination of digests of the current lookahead window is shortened in accordance with the length of the matching portion; and
 (k) continuing processing at a location in the data stream of a next non-matching byte until the data stream has been fully processed;
wherein the method is performed by a computer programmed to perform steps (a)-(k).

* * * * *